(12) United States Patent
Hashimoto

(10) Patent No.: US 6,727,431 B2
(45) Date of Patent: Apr. 27, 2004

(54) OPTICAL MODULE, CIRCUIT BOARD AND ELECTRONIC DEVICE

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/292,372

(22) Filed: Nov. 12, 2002

(65) Prior Publication Data

US 2003/0124773 A1 Jul. 3, 2003

(30) Foreign Application Priority Data

Dec. 27, 2001 (JP) .......................... 2001-397052

(51) Int. Cl.[7] .......................... H05K 5/06; H01L 23/28
(52) U.S. Cl. .................. 174/52.2; 174/52.4; 257/680; 257/434; 257/433
(58) Field of Search ................. 174/52.2, 52.4; 257/680, 433, 434

(56) References Cited

U.S. PATENT DOCUMENTS

| 5,869,896 A | * | 2/1999 | Baker et al. ................. 257/724 |
| 5,912,504 A | * | 6/1999 | Yoshizawa et al. ......... 257/730 |
| 5,962,810 A | * | 10/1999 | Glenn ........................ 174/52.2 |
| 6,134,393 A | * | 10/2000 | Melman .................... 396/429 |
| 6,266,197 B1 | * | 7/2001 | Glenn et al. ................ 359/819 |
| 2001/0020738 A1 | * | 9/2001 | Iizima et al. ............... 257/680 |
| 2003/0122137 A1 | | 7/2003 | Hashimoto ................. 257/80 |
| 2003/0123779 A1 | | 7/2003 | Hashimoto ................. 385/14 |
| 2003/0124762 A1 | | 7/2003 | Hashimoto ................. 438/67 |

* cited by examiner

*Primary Examiner*—Hung V. Ngo
(74) *Attorney, Agent, or Firm*—Hogan & Hartson, LLP

(57) ABSTRACT

An optical chip having an optical section and an electrode is formed above a substrate. The optical chip is surrounded by a body. The optical section is sealed by a first seal section. An electrical connection portion between the electrode of the optical chip and an interconnecting line of the substrate is sealed by a second seal section.

20 Claims, 5 Drawing Sheets

3000

3100

3000

OPTICAL MODULE, CIRCUIT BOARD AND ELECTRONIC DEVICE

Japanese patent application no. 2001-397052 filed on Dec. 27, 2001 is hereby incorporated by reference in its entirety.

BACKGROUND OF THE INVENTION

The present invention relates to an optical module, a circuit board and an electronic device.

A solid state imaging device in which a sensor chip is attached to a body and a lens is attached to this body, is known. In the conventional solid state imaging device, a problem exists in that it is necessary to apply a seal structure to the body so as to protect the sensor chip and an electrical connection portion from humidity so that the device is large-sized.

BRIEF SUMMARY OF THE INVENTION

An optical module as one aspect of the present invention comprises:
- a substrate having an interconnecting line;
- an optical chip formed above the substrate and having an optical section and an electrode electrically connected to the interconnecting line;
- a body formed above the substrate so as to surround at least the optical chip;
- a first seal section formed on the optical chip and sealing the optical section; and
- a second seal section which seals an electrical connection portion between the electrode of the optical chip and the interconnecting line of the substrate.

A circuit board as another aspect of the present invention has the above optical module mounted on the circuit board.

An electronic device as a further aspect of the present invention has the above optical module.

DETAILED DESCRIPTION OF THE EMBODIMENT

Figure 1:
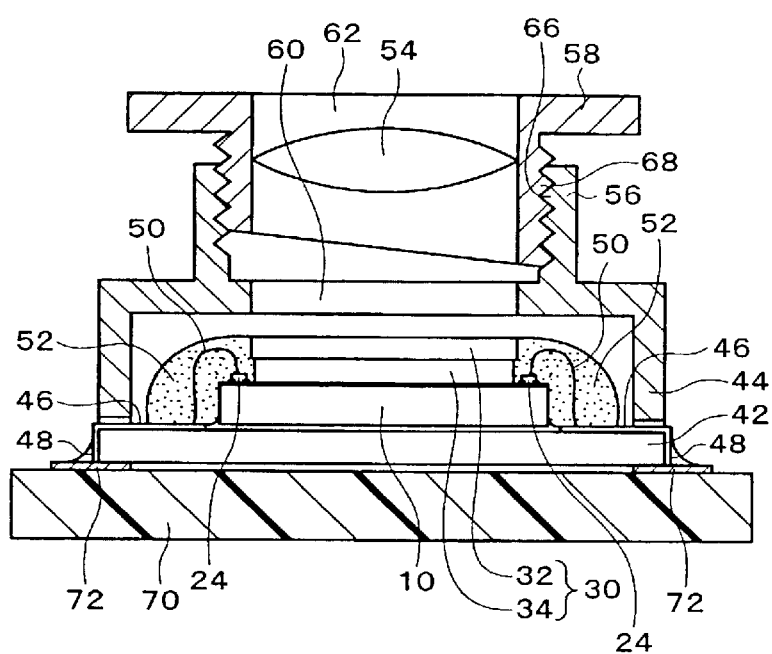
FIG. 1 illustrates an optical module in accordance with an embodiment of the present invention.

An embodiment of the present invention may provide an optical module, a circuit board and an electronic device able to be made compact and having a seal structure.

(1) An optical module in accordance with an embodiment of the present invention comprises:
- a substrate having an interconnecting line;
- an optical chip formed above the substrate and having an optical section and an electrode electrically connected to the interconnecting line;
- a body formed above the substrate so as to surround at least the optical chip;
- a first seal section formed on the optical chip and sealing the optical section; and
- a second seal section which seals an electrical connection portion between the electrode of the optical chip and the interconnecting line of the substrate.

In accordance with the embodiment of the present invention, the optical section and the electrical connection portion can be protected from humidity, dust, and the like. even when no seal structure is applied to the body.

(2) In this optical module,
- the body may be formed above the optical chip so as to surround the optical chip, and
- a first opening may be arranged above the optical section of the body, and a lens is disposed in the first opening.

(3) In this optical module,
- the body may have a first component which holds a lens located above the optical section, and a second component which is directly connected to the substrate and supports the first component above the optical section, and
- a distance between the lens and the optical section may be adjustable by moving the first component.

(4) In this optical module,
- the second component may have a second opening,
- a first screw may be formed outside the first component,
- a second screw may be formed inside the second opening of the second component, and
- the first and second components may be connected to each other by the first and second screws, and the first component may be movable by using the first and second screws.

(5) In this optical module,
- the electrode may be disposed outside the optical section on the optical chip,
- the first seal section may be formed avoiding the electrode, and
- the second seal section may be formed to attach to a side face of the first seal section avoiding an upper face of the first seal section.

(6) This optical module may include a circuit chip above the substrate, and the optical chip may be formed above the circuit chip.

(7) In this optical module, the substrate may further have an external terminal.

(8) In this optical module, the first seal section may have a plate disposed above the optical section, and a spacer formed between the substrate and the plate to support the plate.

(9) In this optical module, the spacer may be continuously formed around the optical section, and a space may be formed between the optical section and the plate.

(10) In this optical module, the space may be a vacuum.

(11) In this optical module, nitrogen or dry air may be included in the space.

(12) In this optical module, the spacer may be a layer for adhering the optical section and the plate.

(13) In this optical module, visible light may pass through the plate and no infrared light may pass through the plate.

(14) In this optical module, the optical section may have a plurality of light receiving elements arranged for image sensing.

(15) In this optical module, the optical section may have a color filter above the light receiving elements.

(16) In this optical module, the optical section may have a micro lens array on the surface of the optical chip.

(17) A circuit board in accordance with another embodiment of the present invention has the above optical module mounted on the circuit board.

(18) An electronic device in accordance with a further embodiment of the present invention has the above optical module.

Embodiments of the present invention will next be described with reference to the drawings.

Figure 2A:
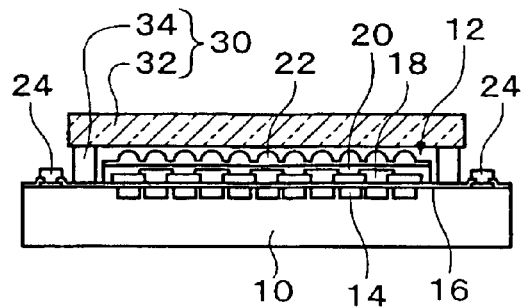
FIGS. 2A and 2B illustrate a first seal section of the optical module in accordance with the embodiment of the present invention.
Figure 2B:
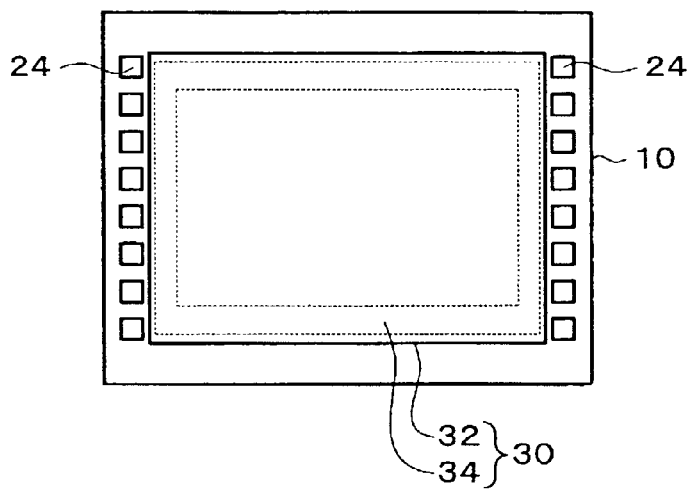

FIG. 1 illustrates an optical module and a circuit board in accordance with an embodiment of the present invention. The optical module has an optical chip 10. FIGS. 2A and 2B are sectional and plan views of the optical chip.

The optical chip 10 has an optical section 12. The optical section 12 is an incident or emitting section of light. The optical section 12 converts light energy and another energy (electricity, for example). Namely, the optical section 12 has a plurality of energy converting elements (a light receiving element and a light transmitting element) 14. In this embodiment, the optical section 12 is a light receiving section. The plural energy converting elements (light receiving elements or image sensor elements) 14 are two-dimensionally arranged so as to perform image sensing. Namely, in this embodiment, the optical module is an image sensor (a CCD or a CMOS sensor, for example). The energy converting element 14 is covered with a passivation film 16. The passivation film 16 has a light transmission property. When the optical chip 10 is manufactured from a semiconductor substrate (a semiconductor wafer, for example), the passivation film 16 may be formed by $SiO_2$ and SiN.

The optical section 12 may have a color filter 18. The color filter 18 is formed on the passivation film 16. Further, a flattened layer 20 is arranged on the color filter 18, and a micro lens array 22 may be arranged on this flattened layer 20.

A plurality of electrodes 24 are formed in the optical chip 10. The electrode 24 has a bump formed on a pad, but may also have only the pad. The electrode 24 is formed outside the optical section 12. The electrode 24 may be also arranged along plural sides (opposed two or four sides, for example) or one side of the optical chip 10.

The optical section 12 is sealed by a first seal section 30. Since there is the first seal section 30, the optical section 12 can be protected from humidity without sealing the optical chip 10 by a substrate 42 and a body 44. The first seal section 30 is directly arranged on the optical chip 10. The first seal section 30 has a plate 32 and as pacer 34. The first seal section 30 is arranged avoiding the electrode 24.

The plate 32 is arranged above the optical section 12. The shape of the plate 32 is not particularly limited, but is a quadrilateral shape, for example. The plate 32 has a light transmission property. Optical glass and plastic having the light transmission property can be used as the plate 32. The plate 32 is used irrespective of the magnitude of a transmission loss if light is transmitted through this plate 32. However, it is more preferable to use the plate 32 having high transmittance and a small loss. Further, only the light of a specific wavelength may transmit the plate 32. For example, the plate 32 may be formed by a material that visible light passes therethrough but light in an infrared area does not pass therethrough. The plate 32 may have a small loss of the visible light, and may also have a large loss of the light in the infrared area. Further, optical processing may be also performed on the surface of the plate 32 so as to have a small loss of the visible light, and a large loss of the light in the infrared area. For example, a film constructed by a material having a small loss of the visible light and a large loss of the light in the infrared area may be also formed in the plate 32.

The spacer 34 is continuously formed around the optical section 12. The spacer 34 may be formed by resin, and may be also formed by thermosetting resin or light curable resin, for example. The spacer 34 formed by thermosetting resin or light curable resin can restrain its deformation by temporarily hardening the spacer 34. Therefore, it is possible to prevent the resin constituting the spacer 34 from being widened onto the optical section 12. If thermoplastic resin is of an ultraviolet hardening type, the irradiation of an ultraviolet ray can be applied to the temporary hardening. The spacer 34 may be also formed by a metal. In this case, a solder material and an adhesive may be used to fix the spacer 34, and the plate 32 or the optical chip 10. The plate 32 and the spacer 34 may be integrally formed by the same material. In this case, for example, the plate 32 and the spacer 34 are formed by a material having the light transmission property such as optical glass or light-transmitting plastic.

The plate 32 and the spacer 34 seal an optical section 22. The spacer 34 supports the plate 32, and a space is formed between the plate 32 and the optical section 12. This space is sealed. This space may be reduced in pressure in comparison with the atmospheric pressure, and may be also set to a vacuum, and may be also filled with nitrogen and dry air.

The optical module has the substrate 42 and the body 44. The body 44 is arranged above the substrate 42 and is formed in a shape surrounding the optical chip 10. The substrate 42 has an interconnecting line 46. The substrate 42 has an external terminal 48. The body 44 has a lens 54.

For example, the substrate 42 is a ceramic substrate. The optical chip 10 is attached to the substrate 42. More particularly, the optical chip 10 is bonded to the substrate 42 in a face-up state in which the surface on which the optical section 12 is formed is facing upward. The optical chip 10 and the substrate 42 may be fixed to each other by an adhesive. The interconnecting line 46 is formed in the substrate 42. The external terminal 48 is arranged in the substrate 42. In the example shown in FIG. 1, part of the interconnecting line 46 functions as the external terminal 48, but a solder ball, and the like, may also formed as the external terminal. The external terminal 48 may be connected to a circuit board 70.

The interconnecting line 46 and the electrode 24 of the optical chip 10 are electrically connected to each other. Wire bonding using a wire 50 may be applied to this electrical connection. An electrical connection portion of the interconnecting line 46 and the electrode 24 is sealed by a second seal section 52. Due to the second seal section 52, the electrical connection portion of the interconnecting line 46 and the electrode 24 can be protected from humidity without forming a seal structure by the substrate 42 and the body 44. Resin may be used as the second seal section 52. In this case, the resin may be arranged by potting. The second seal section 52 may be formed so as not to be attached to the upper face (a passing face for light) of the first seal section 30. The second seal section 52 may be also attached to the side face (a face requiring no passage of light) of the first seal section 30.

The body 44 is attached to the substrate 42. An adhesive may be used in this attachment. Part of the body 44 is located above the forming face of the optical section 12 of the optical chip 10.

The lens 54 is attached to the body 44. The body 44 has a second component 56 as an attaching portion to the substrate 42, and a first component 58 as a lens holder. The lens 54 is attached to the first component 58. First and second openings 62 and 60 are formed above the optical section 12 in the first and second components 58 and 56. The first and second openings 62 and 60 are communicated with each other. The lens 54 is disposed in the first opening 62 of the first component 58. The lens 54 may be fixed into the first opening 62 by a pressing structure (not shown) including a presser movable in the direction along the axis of the first opening 62 by using a screw (not shown) formed inside the first component 58. In this case, the presser preferably has a light transmission property. Namely, the lens 54 is located above the optical section 12. First and second screws 68 and 66 are formed outside the first component 58 and inside the second opening 60 of the second component 56. The first and second components 58 and 56 are connected by these screws 68 and 66. Accordingly, the first and second components 58 and 56 are moved by the first and second screws 68 and 66 in the direction along the axis of the first and second openings 62 and 60. Thus, the focal point of the lens 54 can be adjusted.

The above optical module is mounted to the circuit board 70. An interconnection pattern 72 is formed in the circuit board 70, and the external terminal 48 of the optical module is joined to the interconnection pattern 72. One of a solder material (solder or brazing alloy), an adhesive, an anisotropic electrically conductive material and an anisotropic electrically conductive film may be used in this joining, and metallic joining may be also applied.

The present invention is not limited to the above embodiment, but can be variously modified. For example, the present invention includes substantially the same construction (the same construction in function, method and result, or the same construction in object and result, for example) as the construction described in the embodiment. Further, the present invention includes a construction in which an unessential element of the construction described in the embodiment is replaced. Further, the present invention includes a construction resulting in the same effect as the construction described in the embodiment, or a construction able to achieve the same object. Further, the present invention includes a construction in which a known technique is added to the construction described in the embodiment.

Other Embodiments

Figure 3:
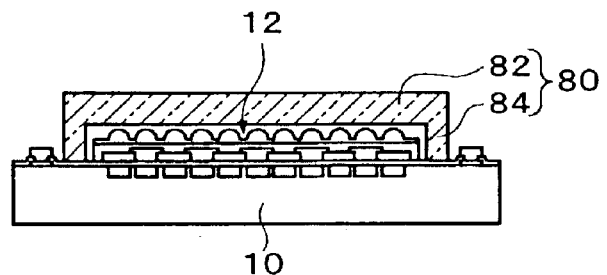
FIG. 3 illustrates a modification of the first seal section in the optical module in accordance with the embodiment of the present invention.

FIG. 3 shows a modification of the optical module in accordance with an embodiment of the present invention. FIG. 3 shows a first seal section different from that in the above embodiment. The first seal section 80 has a plate 82 and a spacer 84 integrally formed. For example, the first seal section 80 can be formed by injection-molding resin. For example, the spacer 84 can be adhered to the optical chip 10 by an adhesive. The other details are similar to those in the description of the above embodiment.

Figure 4:
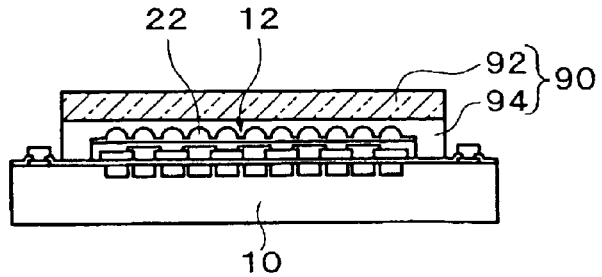
FIG. 4 illustrates a modification of the first seal section in the optical module in accordance with the embodiment of the present invention.

FIG. 4 shows a modification of the optical module in accordance with an embodiment of the present invention. FIG. 4 shows a first seal section different from that in the above embodiment. The first seal section 90 has a plate 92 and a spacer 94. The spacer 94 is a layer for adhering the optical section 12 with the plate 92. Resin (thermoplastic resin, for example) may be used as the spacer 94. An adhesive may be also used as the spacer 94. When the spacer 94 is formed on a micro lens array 22, absolute refractive indexes of light in both the spacer 94 and the micro lens array 22 maybe set to be different from each other so as to improve the concentration ratio of the micro lens array 22. More particularly, if the micro lens array 22 is a convex lens as shown in FIG. 4, the absolute refractive index of the spacer 94 is smaller than that of the micro lens array 22. When the micro lens array 22 is a concave lens, the absolute refractive index of the spacer 94 is greater than that of the micro lens array 22.

Figure 5:
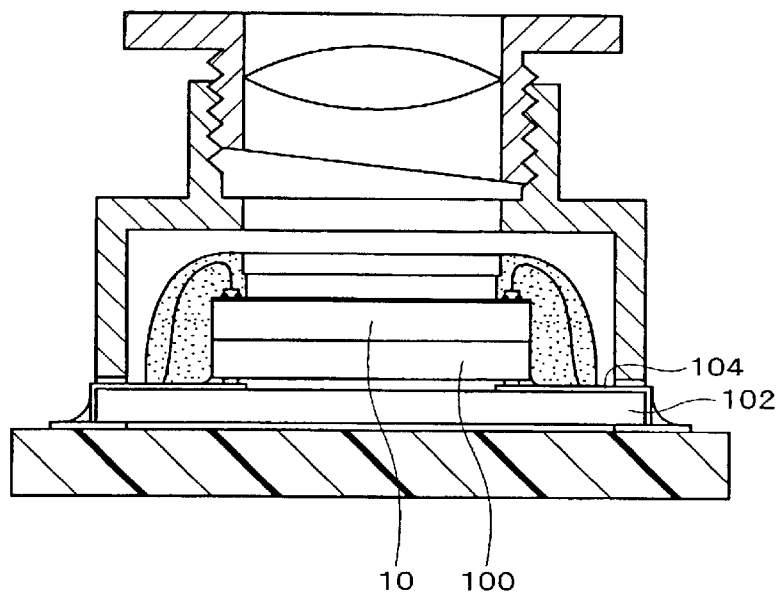
FIG. 5 illustrates a modification of the optical module in accordance with the embodiment of the present invention.

FIG. 5 shows a modification of the optical module in accordance with an embodiment of the present invention. The optical module shown in FIG. 5 has a circuit chip (semiconductor chip) 100 stacked with the optical chip 10. More particularly, the optical chip 10 is attached onto the circuit chip 100. An adhesive can be used in this attachment. The circuit chip 100 is bonded to a substrate 102 in a face-down state (face-down bonding structure). Namely, electrical connection is made by directing the forming face of an electrode (bump) of the circuit chip 100 toward the substrate 102 forming interconnecting line 104 therein. The optical chip 10 and the circuit chip 100 are electrically connected to each other through the interconnecting line 104. The other details are similar to those in the optical module shown in FIG. 1.

Figure 6:
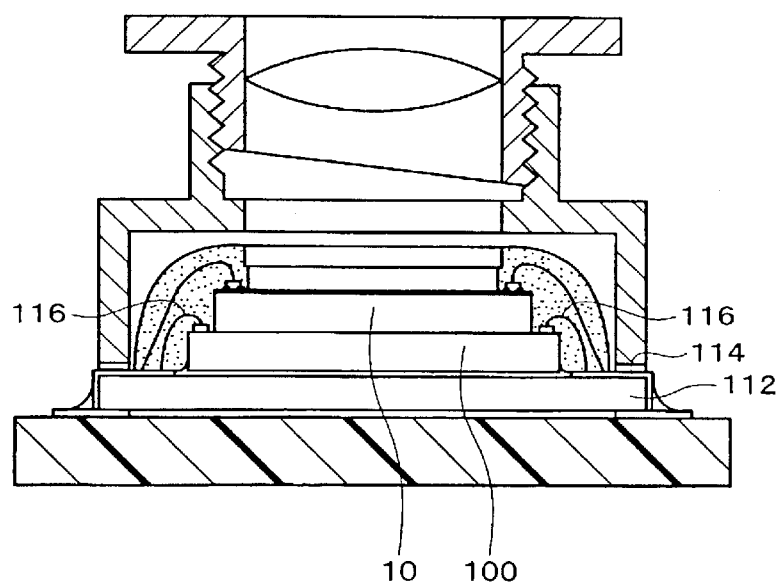
FIG. 6 illustrates a modification of the optical module in accordance with the embodiment of the present invention.

FIG. 6 shows a modification of the optical module in accordance with the embodiment of the present invention. The optical module shown in FIG. 6 has a circuit chip (semiconductor chip) 110 stacked with the optical chip 10. More particularly, the optical chip 10 is attached onto the circuit chip 110. An adhesive can be used in this attachment. The circuit chip 110 is bonded to a substrate 112 in a face-up state (face-up bonding structure). Namely, the forming face of an electrode (bump) of the circuit chip 110 faces to the direction opposed to the substrate 112 in which an interconnecting line 114 is formed, and electrical connection is made by a wire 116, for example. The optical chip 10 and the circuit chip 110 maybe electrically connected to each other through the interconnecting line 114, and may be also electrically connected to each other by a wire. The other details are similar to those in the optical module shown in FIG. 1.

In accordance with the structure as shown in FIG. 5 or 6, for example, the volume of the optical module can be greatly reduced since the optical chip 10 and the circuit chips 100 and 110 used in signal processing, and the like. after energy conversion using this optical chip 10 are integrated. Accordingly, the optical module can be effectively made compact.

Figure 7:
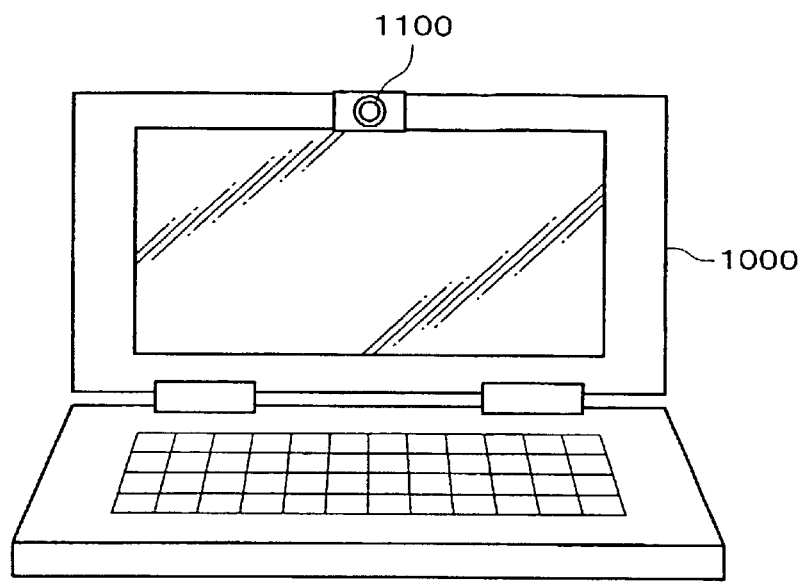
FIG. 7 shows an electronic device in accordance with the embodiment of the present invention.
Figure 8:
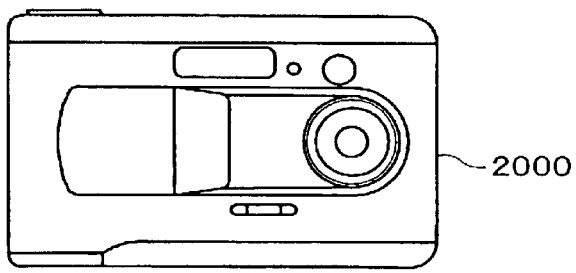
FIG. 8 shows an electronic device in accordance with the embodiment of the present invention.
Figure 9A:
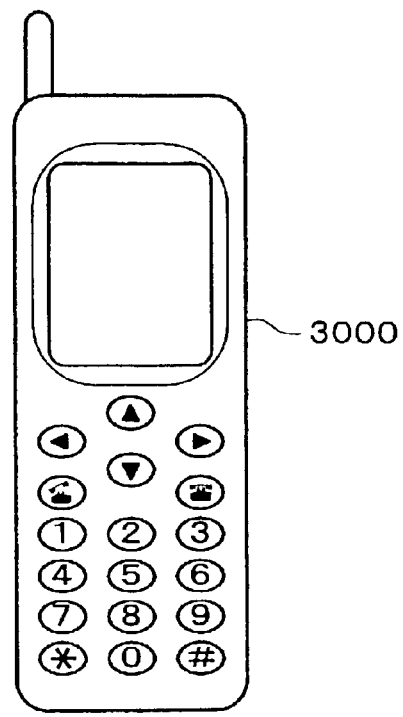
FIGS. 9A to 9B show an electronic device in accordance with the embodiment of the present invention.
Figure 9B:
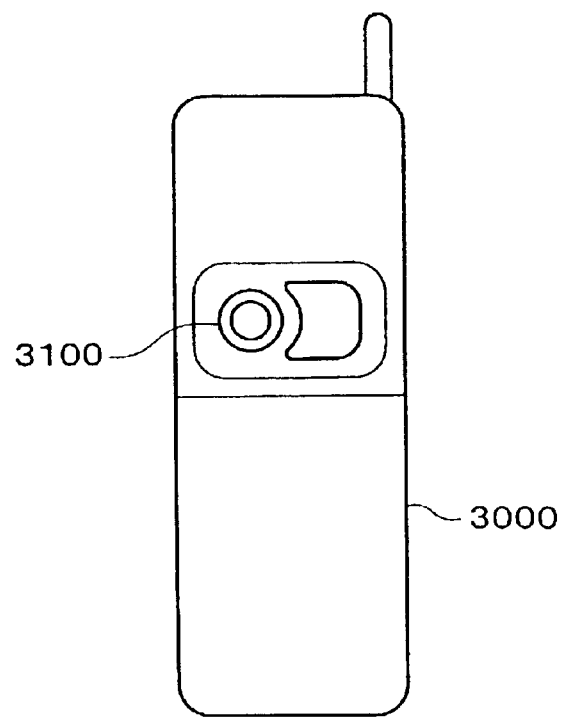

A notebook type personal computer 1000 shown in FIG. 7 as an electronic device in accordance with the embodiment of the present invention has a camera 1100 in which the optical module is incorporated. A digital camera 2000 shown in FIG. 8 also has the optical module. Further, a portable telephone 3000 shown in FIGS. 9A and 9B has a camera 3100 in which the optical module is incorporated.

What is claimed is:

1. An optical module comprising:
   a substrate having an interconnecting line: the substrate having external terminals on its side;
   an optical chip mounted on the substrate and having an optical section and an electrode electrically connected to the interconnecting line;
   a body formed above the substrate so as to surround at least the optical chip;
   a first seal section formed on the optical chip and sealing the optical section; and a second seal section which seals an electrical connection portion between the electrode of the optical chip and the interconnecting line of the substrate.

2. The optical module as defined by claim 1, wherein the body is formed above the optical chip so as to surround the optical chip, and wherein a first opening is arranged above the optical section of the body, and a lens is disposed in the first opening.

3. The optical module as defined by claim 2, wherein the body has a first component which holds a lens located above the optical section, and a second component which is directly connected to the substrate and supports the first component above the optical section, and wherein a distance between the lens and the optical section is adjustable by moving the first component.

4. The optical module as defined by claim 3, wherein the second component has a second opening, wherein a first screw is formed outside the first component, wherein a second screw is formed inside the second opening of the second component, and wherein the first and second components are connected to each other by the first and second screws, and the first component is movable by using the first and second screws.

5. The optical module as defined by claim 1, wherein the body has a first component which holds a lens located above the optical section, and a second component which is directly connected to the substrate and supports the first component above the optical section, and wherein a distance between the lens and the optical section is adjustable by moving the first component.

6. The optical module as defined by claim 5, wherein the second component has a second opening, wherein a first screw is formed outside the first component, wherein a second screw is formed inside the second opening of the second component, and wherein the first and second components are connected to each other by the first and second screws, and the first component is movable by using the first and second screws.

7. The optical module as defined by claim 1, wherein the electrode is disposed outside the optical section on the optical chip, wherein the first seal section is formed avoiding the electrode, and wherein the second seal section is formed to attach to a side face of the first seal section avoiding an upper face of the first seal section.

8. The optical module as defined by claim 1, further comprising a circuit chip above the substrate, wherein the optical chip is formed above the circuit chip.

9. The optical module as defined by claim 1, wherein the external terminals are formed so as not to project from a surface opposite to a surface on which the optical chin is mounted.

10. The optical module as defined by claim 1, wherein the first seal section has a plate disposed above the optical section, and a spacer formed between the substrate and the plate to support the plate.

11. The optical module as defined by claim 10, wherein the spacer is continuously formed around the optical section, and wherein a space is formed between the optical section and the plate.

12. The optical module as defined by claim 11, wherein the space is a vacuum.

13. The optical module as defined by claim 11, wherein nitrogen or dry air is included in the space.

14. The optical module as defined by claim 10, wherein the spacer is a layer for adhering the optical section and the plate.

15. The optical module as defined by claim 10, wherein visible light passes through the plate and no infrared light passes through the plate.

16. The optical module as defined by claim 1, wherein the optical section has a plurality of light receiving elements arranged for image sensing.

17. The optical module as defined by claim 16, wherein the optical section has a color filter above the light receiving elements.

18. The optical module as defined by claim 16, wherein the optical section has a micro lens array on the surface of the optical chip.

19. A circuit board on which the optical module as defined by claim 1 is mounted.

20. An electronic device having the optical module as defined by claim 1.

* * * * *